(12) United States Patent
Bezel et al.

(10) Patent No.: US 11,121,521 B2
(45) Date of Patent: Sep. 14, 2021

(54) SYSTEM AND METHOD FOR PUMPING LASER SUSTAINED PLASMA WITH INTERLACED PULSED ILLUMINATION SOURCES

(71) Applicant: KLA Corporation, Milpitas, CA (US)

(72) Inventors: Ilya Bezel, Mountain View, CA (US); Matthew Derstine, Los Gatos, CA (US); William Schumaker, Palo Alto, CA (US); Michael Friedmann, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 1 day.

(21) Appl. No.: 16/791,488

(22) Filed: Feb. 14, 2020

(65) Prior Publication Data

US 2020/0274314 A1     Aug. 27, 2020

Related U.S. Application Data

(60) Provisional application No. 62/810,176, filed on Feb. 25, 2019.

(51) Int. Cl.
*H01S 3/13* (2006.01)
*F21V 9/06* (2018.01)
(Continued)

(52) U.S. Cl.
CPC ............ *H01S 3/13013* (2019.08); *F21V 9/06* (2013.01); *H01S 3/1001* (2019.08);
(Continued)

(58) Field of Classification Search
CPC ........ H01S 3/1001; H01S 3/1024; H01S 3/09; H01S 3/13013; H01S 5/04
See application file for complete search history.

(56) References Cited

U.S. PATENT DOCUMENTS

| | | | | |
|---|---|---|---|---|
| 5,434,875 A | * | 7/1995 | Rieger | ...................... H01S 3/07 372/12 |
| 5,539,764 A | * | 7/1996 | Shields | ...................... H01S 3/07 372/10 |

(Continued)

FOREIGN PATENT DOCUMENTS

| | | |
|---|---|---|
| KR | 10200001003 A | 9/2000 |
| WO | 2008105080 A1 | 6/2010 |

OTHER PUBLICATIONS

Schreiber, A. et al., "Radiation resistance of quartz glass for VUV discharge lamps", J. Phys. D Appl. Phys., 38 (2005), pp. 3242-3250.

(Continued)

*Primary Examiner* — Kinam Park
(74) *Attorney, Agent, or Firm* — Suiter Swantz pc llo

(57) ABSTRACT

A system for pumping laser sustained plasma is disclosed. The system includes a plurality of pump modules configured to generate respective pulses of pump illumination for the laser sustained plasma, wherein at least one pump module is configured to generate a train of pump pulses that is interlaced in time with another train of pump pulses generated by at least one other pump module of the plurality of pump modules. The system further includes a plurality of non-collinear illumination paths configured to direct the respective pulses of pump illumination from the plurality of pump modules into a collection volume of the laser sustained plasma.

34 Claims, 11 Drawing Sheets

(51) Int. Cl.
*H01S 3/102* (2006.01)
*H01S 3/10* (2006.01)
H01S 3/0943 (2006.01)
H01S 3/131 (2006.01)
H01S 3/09 (2006.01)
H01S 5/04 (2006.01)

(52) U.S. Cl.
CPC .............. *H01S 3/1024* (2013.01); *H01S 3/09* (2013.01); *H01S 3/0943* (2013.01); *H01S 3/1312* (2013.01); *H01S 5/04* (2013.01)

(56) References Cited

U.S. PATENT DOCUMENTS

| | | | |
|---|---|---|---|
| 5,608,526 | A | 3/1997 | Piwonka-Corle et al. |
| 5,790,574 | A * | 8/1998 | Rieger .................... H01S 3/115 372/12 |
| 5,999,310 | A | 12/1999 | Shafer et al. |
| 6,016,324 | A * | 1/2000 | Rieger .................... H01S 3/117 372/10 |
| 6,297,880 | B1 | 10/2001 | Rosencwaig et al. |
| 7,345,825 | B2 | 3/2008 | Chuang et al. |
| 7,435,982 | B2 | 10/2008 | Smith |
| 7,525,649 | B1 | 4/2009 | Leong et al. |
| 7,786,455 | B2 | 8/2010 | Smith |
| 7,957,066 | B2 | 6/2011 | Armstrong et al. |
| 9,099,292 | B1 | 8/2015 | Bezel et al. |
| 9,185,788 | B2 | 11/2015 | Bezel et al. |
| 9,228,943 | B2 | 1/2016 | Wang et al. |
| 9,318,311 | B2 | 4/2016 | Chimmalgi et al. |
| 9,615,439 | B2 | 4/2017 | Bezel et al. |
| 9,775,226 | B1 | 9/2017 | Bezel et al. |
| 9,927,094 | B2 | 3/2018 | Bezel et al. |
| 2015/0282288 | A1 * | 10/2015 | Bezel .................... H05G 2/001 250/504 R |
| 2016/0268120 | A1 | 9/2016 | Bezel et al. |
| 2016/0381776 | A1 | 12/2016 | Derstine et al. |

OTHER PUBLICATIONS

International Search Report dated Jun. 16, 2020 for PCT/US2020/019399.

Kazansky, Peter G. et al., "Quill and Nonreciprocal Ultrafast Laser Writing", Part of the Topics in Applied Physics book series (TAP, vol. 123), pp. 127-151, Dec. 26, 2011.

* cited by examiner

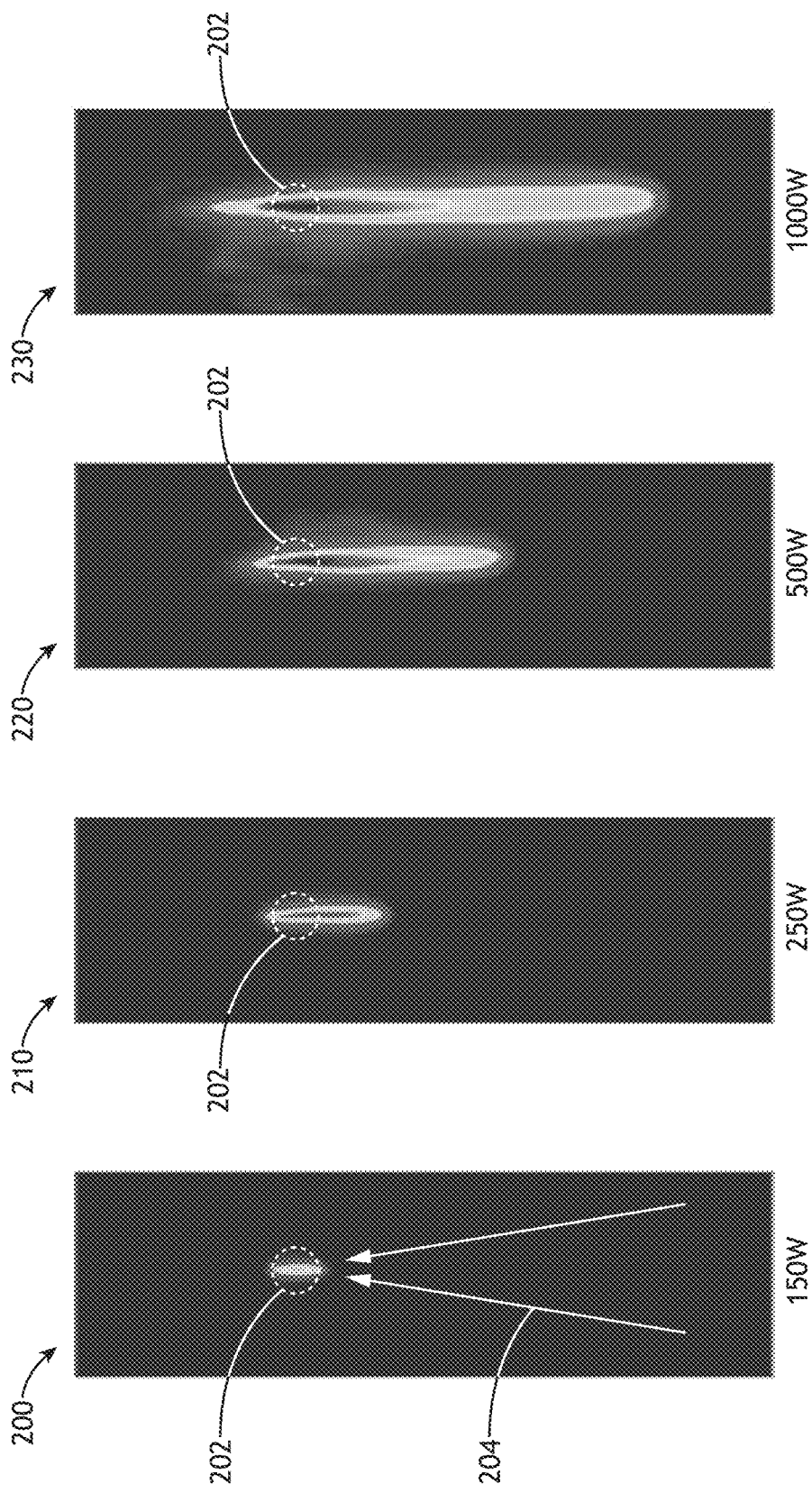

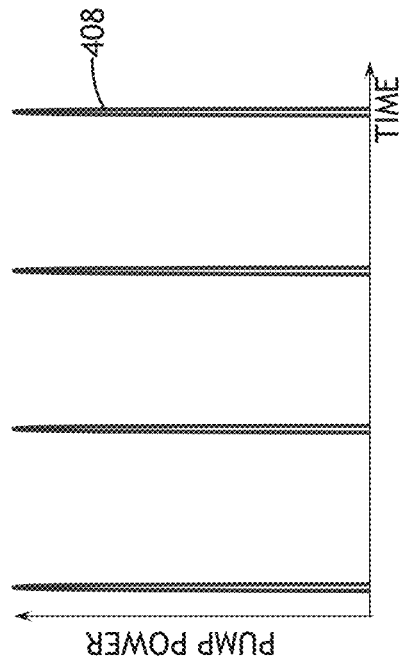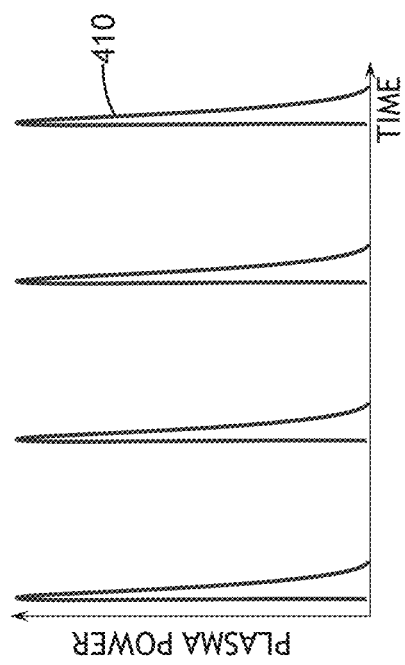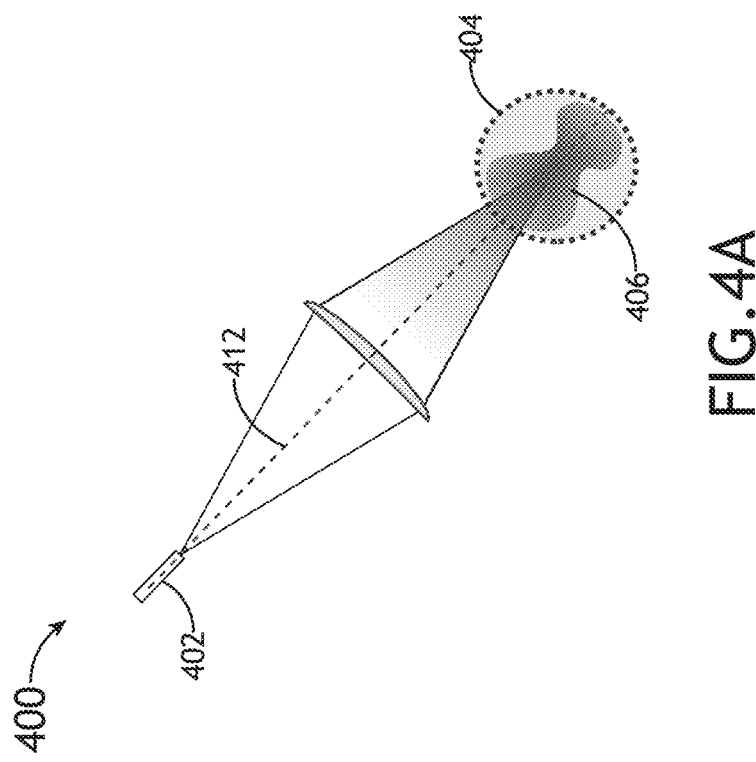

SYSTEM AND METHOD FOR PUMPING LASER SUSTAINED PLASMA WITH INTERLACED PULSED ILLUMINATION SOURCES

CROSS-REFERENCE TO RELATED APPLICATIONS

The present application claims priority to U.S. Provisional Application Ser. No. 62/810,176, filed Feb. 25, 2019 and titled "Plasma Light Source Sustained by Interlaced Pulsed Lasers," with inventors Ilya Bezel, Matthew Derstine, William Schumaker, and Michael Friedmann, which is incorporated herein by reference in its entirety.

TECHNICAL FIELD

The present disclosure relates generally to illumination sources and more particularly to laser sustained plasma (LSP) sources.

BACKGROUND

Generally, there are two regions of space in an LSP-based illumination system: inside a collection volume and outside of the collection volume. The collection volume is defined as the volume of space where light collection efficiency is the highest. Increasing the plasma emissivity in this region leads to higher collectable power and better performance of the illumination system. In LSP, the brightest part of the plasma is usually near the pump laser focus, and the pump laser focus is usually placed in or near the collection volume. If the plasma grows outside of the collection volume, the light emitted from the plasma is mostly wasted since collection efficiency there is small. For the generation of light in 120-1000 nm wavelength range, it is beneficial to have this volume filled with plasma of about 1-5 eV. If the plasma becomes too cold, the emission is low; if it is too hot, the plasma emits at much shorter wavelengths and conversion efficiency suffers.

In operation of an LSP-based illumination system it is important to recognize that when the gas temperature is low, the pump laser light travels through it with very little absorption. When the temperature of the gas is high, i.e., where plasma is sustained, absorption of the pump power is high. Thus, in order to create an efficient light source, it is desirable to have conditions where the gas absorption of the pump laser is high in the collection volume and is low outside of the collection volume, i.e., to create a plasma that does not significantly exceed the collection volume, especially in the path of pump laser propagation.

SUMMARY

A system for pumping laser sustained plasma is disclosed, in accordance with one or more illustrative embodiments of this disclosure. In an illustrative embodiment, the system includes a plurality of pump modules configured to generate respective pulses of pump illumination for the laser sustained plasma, wherein at least one pump module is configured to generate a train of pump pulses that is interlaced in time with another train of pump pulses generated by at least one other pump module of the plurality of pump modules. In embodiments, the system may further include a plurality of non-collinear illumination paths configured to direct the respective pulses of pump illumination from the plurality of pump modules into a collection volume of the laser sustained plasma.

A system for generating broadband illumination is also disclosed, in accordance with one or more illustrative embodiments of this disclosure. In an illustrative embodiment, the system includes a plasma forming material and a plurality of pump modules configured to generate respective pulses of pump illumination for a laser sustained plasma generated by exciting the plasma forming material, wherein at least one pump module is configured to generate a train of pump pulses that is interlaced in time with another train of pump pulses generated by at least one other pump module of the plurality of pump modules. In embodiments, the system may further include a plurality of non-collinear illumination paths configured to direct the respective pulses of pump illumination from the plurality of pump modules into a collection volume of the laser sustained plasma. In some embodiments, the system may further include one or more collection optics configured to receive broadband illumination emitted by the laser sustained plasma and further configured to direct the broadband illumination to an output (e.g., an illuminator output for a metrology system, inspection system, or the like).

A method of pumping laser sustained plasma is also disclosed, in accordance with one or more illustrative embodiments of this disclosure. In an illustrative embodiment, the method includes: generating pulses of pump illumination for the laser sustained plasma with a plurality of pump modules by generating, via at least one pump module, a train of pump pulses that is interlaced in time with another train of pump pulses generated by at least one other pump module of the plurality of pump modules; and directing the respective pulses of pump illumination from the plurality of pump modules along a plurality of non-collinear illumination paths into a collection volume of the laser sustained plasma.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 2A illustrates an example view of LSP pumped at different laser powers with a conventional pump module with low numerical aperture (NA), such as in the system illustrated in FIG. 1A, in accordance with one or more embodiments of the present disclosure;

FIG. 2B illustrates an example view of LSP pumped at different laser powers with a conventional pump module with low numerical aperture (NA), such as in the system illustrated in FIG. 1A, in accordance with one or more embodiments of the present disclosure;

FIG. 2C illustrates an example view of LSP pumped at different laser powers with a conventional pump module with low numerical aperture (NA), such as in the system illustrated in FIG. 1A, in accordance with one or more embodiments of the present disclosure;

FIG. 2D illustrates an example view of LSP pumped at different laser powers with a conventional pump module with low numerical aperture (NA), such as in the system illustrated in FIG. 1A, in accordance with one or more embodiments of the present disclosure;

FIG. 4A illustrates plasma growth of LSP pumped with low-repetition rate short-pulse illumination, in accordance with one or more embodiments of the present disclosure;

FIG. 4B is an example of a graphical plot of the pump power for low-repetition rate short-pulse illumination inside a collection volume of the LSP illustrated in FIG. 4A, in accordance with one or more embodiments of the present disclosure;

FIG. 4C is an example of a graphical plot of the plasma emissivity inside a collection volume of the LSP illustrated in FIG. 4A, in accordance with one or more embodiments of the present disclosure;

DETAILED DESCRIPTION

Figure 1A:
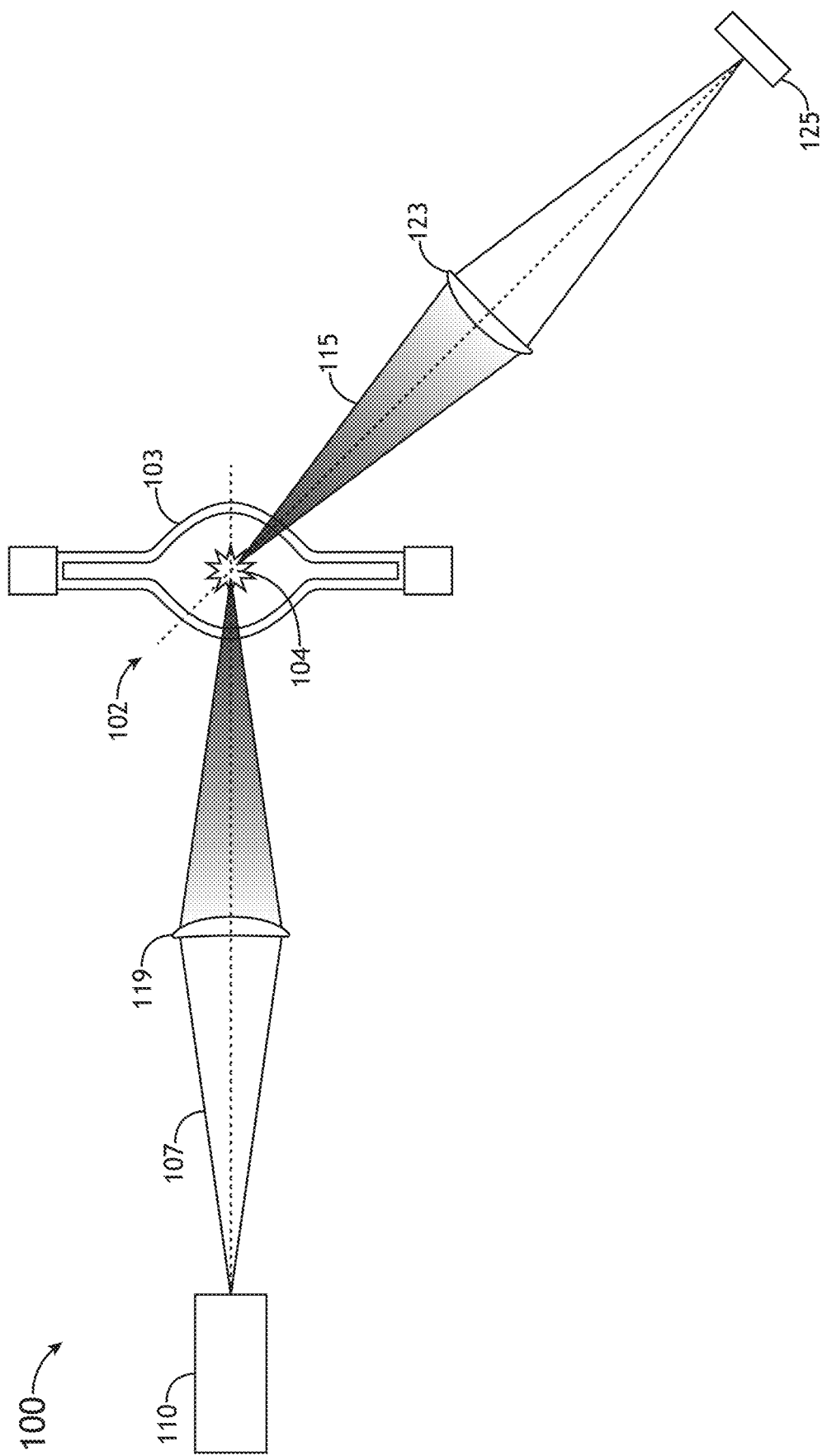
FIG. 1A is a schematic illustration of a laser sustained plasma (LSP) illumination system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Laser sustained plasmas (LSPs) are used as broadband light sources in a variety of applications including wafer inspection and metrology. Generally, there are two regions of space in an LSP-based illumination system: inside a collection volume and outside of the collection volume. The collection volume is defined as the volume of space where light collection efficiency is the highest. Increasing the plasma emissivity in this region leads to higher collectable power and better performance of the illumination system. In LSP, the brightest part of the plasma is usually near the pump laser focus, and the pump laser focus is usually placed in or near the collection volume. If the plasma grows outside of the collection volume, the light emitted from the plasma is mostly wasted since collection efficiency there is small. For the generation of light in 120-1000 nm wavelength range, it is beneficial to have this volume filled with plasma of about 1-5 eV. If the plasma becomes too cold, the emission is low; if it is too hot, the plasma emits at much shorter wavelengths and conversion efficiency suffers.

In operation of an LSP-based illumination system it is important to recognize that when the gas temperature is low, the pump laser light travels through it with very little absorption. When the temperature of the gas is high, i.e., where plasma is sustained, absorption of the pump power is high. Thus, in order to create an efficient light source, it is desirable to have conditions where the gas absorption of the pump laser is high in the collection volume and is low outside of the collection volume, i.e., to create a plasma that does not significantly exceed the collection volume, especially in the path of pump laser propagation.

With reference to FIGS. 1A through 9, a system and method for pumping LSP with interlaced pulsed illumination sources is presented in this disclosure. In an illustrative embodiment, the system includes a plurality of pump modules configured to generate respective pulses of pump illumination for the laser sustained plasma, wherein at least one pump module is configured to generate a train of pump pulses that is interlaced in time with another train of pump pulses generated by at least one other pump module of the plurality of pump modules. In embodiments, the system may further include a plurality of non-collinear illumination paths configured to direct the respective pulses of pump illumination from the plurality of pump modules into a collection volume of the laser sustained plasma. Since the pulses from each pump channel are interlaced in time, the repetition rate of pump pulses inside the collection volume is higher than the repetition rate of each of the channels individually. Furthermore, outside of the collection volume, the degree of spatial overlap between the channels is small. This setup allows for delivery of the pump laser power to a central portion of the plasma (i.e., to the collection volume) without loss by absorption of the plasma outside of the collection volume. By the time the next pulse arrives from a pump channel, the plasma formed in its path by the previous pulse has already cooled down and does not absorb the pump power. In the center of the plasma, the LSP is sustained in a continuous wave (CW)-like manner and is not limited by the duty cycle of standard pulsed arrangements.

Figure 1B:
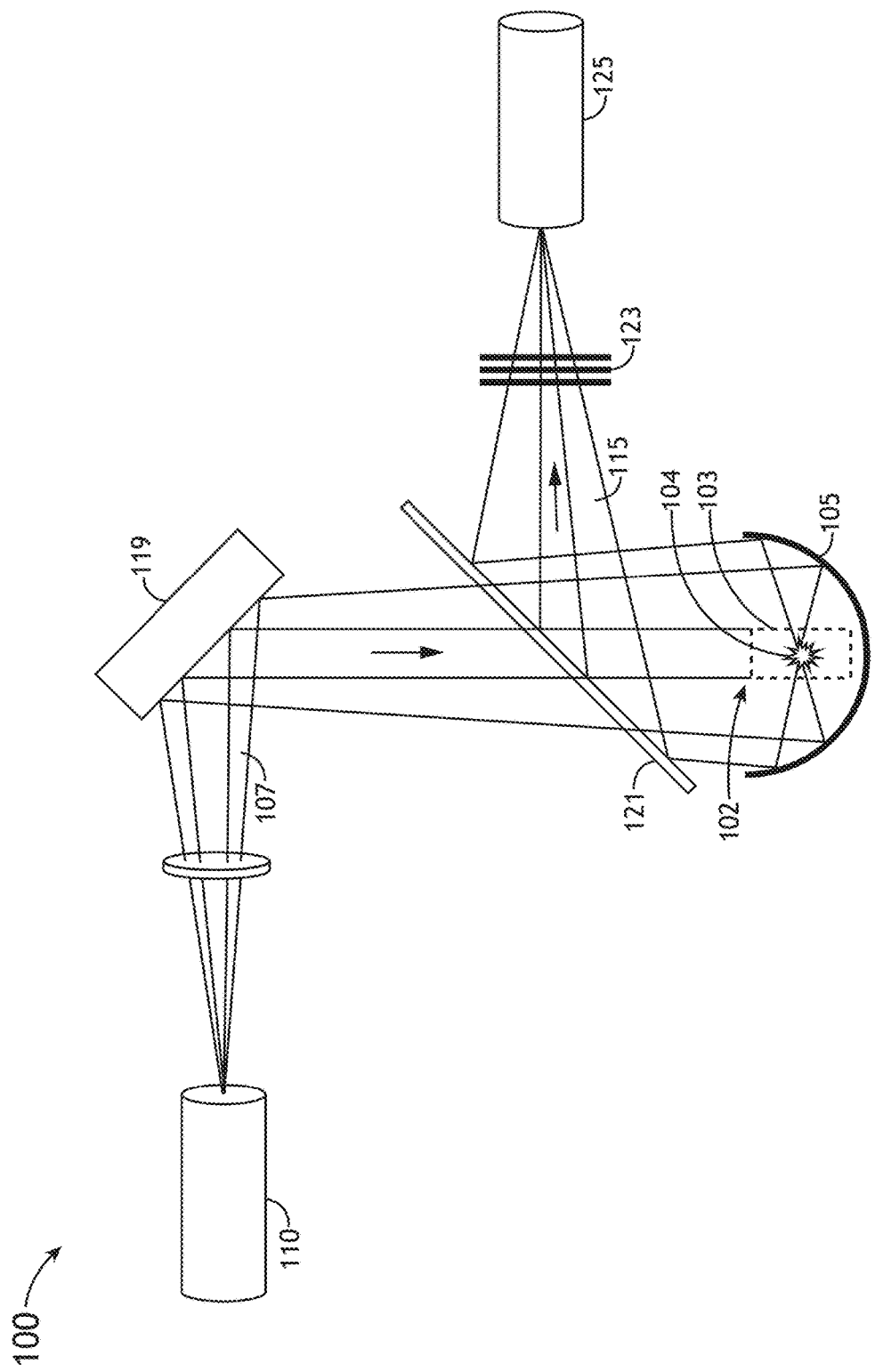
FIG. 1B is a schematic illustration of an LSP illumination system, in accordance with one or more embodiments of the present disclosure.
Figure 1C:
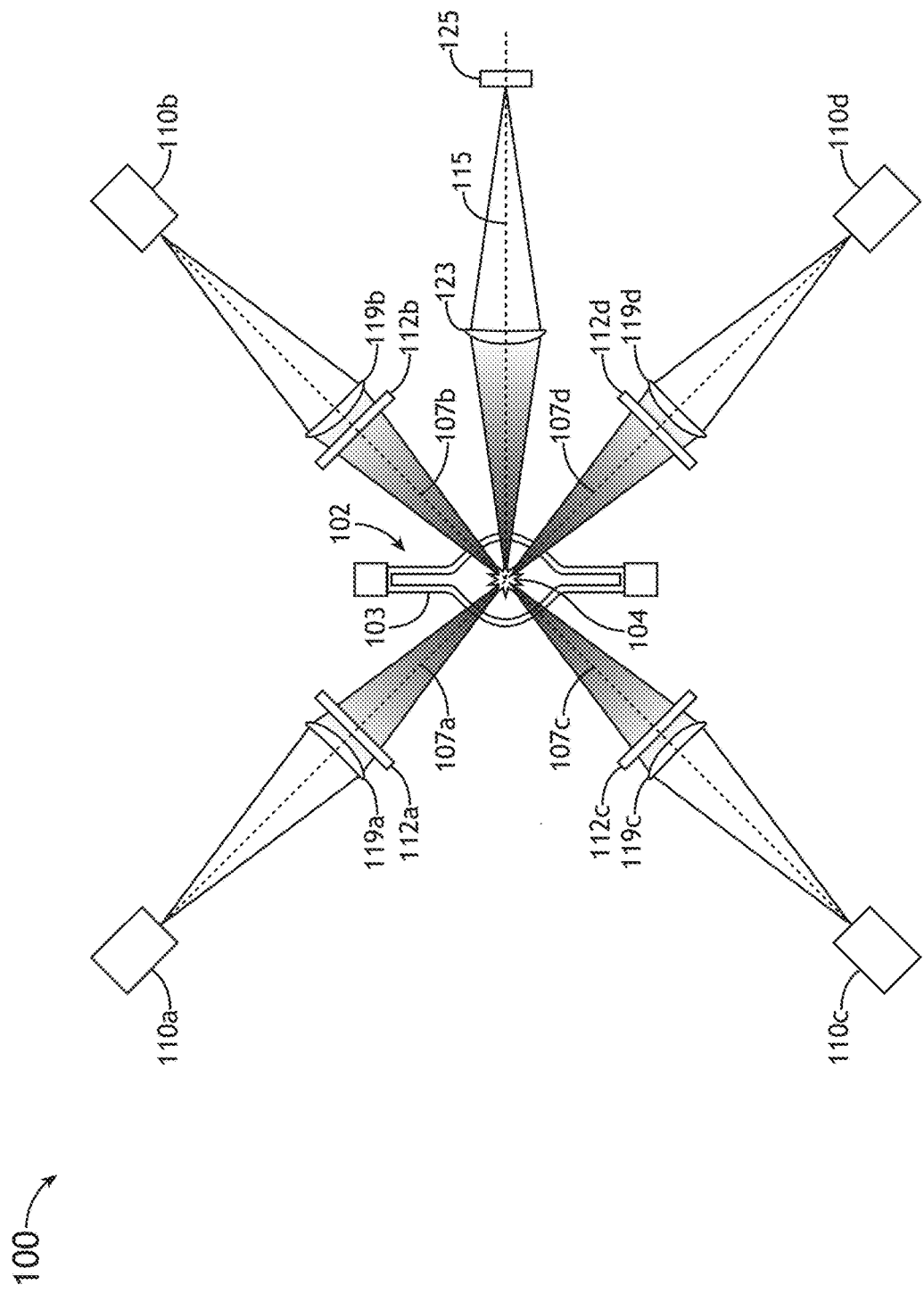
FIG. 1C is a schematic illustration of an LSP illumination system with multiple pump modules, in accordance with one or more embodiments of the present disclosure.

FIGS. 1A through 1C illustrate embodiments of an LSP illumination system 100 for generating broadband illumination by forming and/or sustaining LSP. The generation of plasma is generally described in U.S. Pat. No. 7,786,455, granted on Aug. 31, 2010; and U.S. Pat. No. 7,435,982, granted on Oct. 14, 2008, which are incorporated herein by reference in their entirety. Various plasma cell designs and plasma control mechanisms are described in U.S. Pat. No. 9,318,311, granted on Apr. 19, 2016, which is incorporated herein by reference in the entirety. The generation of plasma is also generally described in U.S. Pat. No. 9,615,439, granted on Apr. 4, 2017, which is incorporated by reference herein in the entirety. Plasma cell and control mechanisms are also described in U.S. Pat. No. 9,775,226, granted on Sep. 26, 2017, which is incorporated by reference herein in the entirety. Plasma cell and control mechanisms are also described in U.S. Pat. No. 9,185,788, granted on Nov. 10, 2015, which is incorporated by reference herein in the entirety. Plasma cell and control mechanisms are also described in U.S. Pat. No. 9,927,094, granted on Mar. 27, 2018, which is incorporated by reference herein in the entirety. In a general sense, the system 100 should be interpreted to extend to any plasma (e.g., LSP) based illumination source known in the art.

FIGS. 1A-1C illustrate a schematic view of an LSP illumination system 100, in accordance with one or more embodiments of the present disclosure. In embodiments, the system 100 includes one or more pump modules 110 configured to generate pump illumination 107 of a selected wavelength, or wavelength range, such as, but not limited to, infrared (IR) illumination, visible (VIS) illumination, or ultraviolet (UV) illumination. In some embodiments, a pump module 110 may be configured to generate illumination 107 having a frequency (or frequency band) in the range of 3 terahertz (THz) to 3 petahertz (PHz) and/or a wavelength (or range of wavelengths) in the range of 100 nanometers (nm) to 100 micrometers (µm). For example, the one or more pump modules 110 may be configured to emit pump illumination 107 in the IR and/or VIS spectral ranges. In another example, the one or more pump modules 110 may be configured to emit pump illumination 107 in the UV spectral range.

Each pump module 110 may include one or more lasers. In a general sense, the pump module 110 may include any laser system known in the art. For instance, the pump module 110 may include any laser system known in the art capable of emitting illumination in the infrared, visible or ultraviolet portions of the electromagnetic spectrum. In embodiments, a pump module 110 may include a laser system configured to emit CW illumination, configured to emit pulsed illumination, or configured to selectively emit CW or pulsed illumination (e.g., based upon a selected mode of the pump module 110). For example, the pump module 110 may include, but is not limited to, a Yb or Yt fiber laser, a Yb or Yt disk laser, Nd:YAG solid state laser, Nd:YLF laser, or the like. In other embodiments, the pump module 110 may include one or more non-laser sources. For example, the pump module 110 may include any non-laser illumination source known in the art, such as a non-laser system capable of emitting illumination discretely or continuously in the infrared, visible or ultraviolet portions of the electromagnetic spectrum. In some embodiments, the system 100 may include a plurality of pump modules 110 (e.g., pump modules 110A, 110B, 110C, 110D) configured to generate pump illumination (e.g., illumination 107A, 107B, 107C, 107D) that is directed at the plasma 104 or at plasma-forming material (to generate plasma 104).

It is contemplated that a plasma 104 (e.g., LSP) can be sustained by a train of short pulses provided that the repetition rate of these pulses is higher than the inverse time of plasma decay. Typically, it takes about a microsecond to extinguish LSP. Thus, in some embodiments, the pump module 110 is configured to emit pulsed illumination with a 1 megahertz (MHz) or higher repetition rate to ensure that the next pump pulse arrives to the plasma 104 before it has a chance to go off. In other embodiments, the repetition rate of the pulsed illumination source is at least 200 kilohertz. In some embodiments, the repetition rate of the pulsed illumination source is in the range of 1 megahertz to 1000 megahertz. In some embodiments, a pulse duration of the pulsed illumination source is in the range of 1 picosecond to 1000 picoseconds. In an embodiment, the pump module 110 is a mode-locked Nd:YAG laser with about 100 MHz repetition rate and about 100 picosecond pulse. These examples are provided for illustrative purposes and are not intended as limitations of the present disclosure unless otherwise provided herein.

A pump module 110 may include, but is not limited to, a laser light source (e.g., a diode laser, fiber laser, fiber-coupled diode laser, free-range laser, or the like) and can also include or can be aligned with a set of optics 119 that shapes and focuses the laser light into or in the vicinity of the plasma 104. For example, as shown in FIG. 1C, pump modules 110a, 110b, 110c, and 110d may have respective optics 119a, 119b, 119c, and 119d configured to shape and focus pump illumination 107a, 107b, 107c, and 107d into or in proximity to the plasma 104.

In some embodiments, a pump module 110 may also have at least one blocking filter 112 configured to prevent at least a portion of the output illumination 115 (e.g., broadband illumination generated by the plasma 104) from being redirected back into the pump module 110. For example, as shown in FIG. 1C, pump modules 110a, 110b, 110c, and 110d may have respective blocking filters 112a, 112b, 112c, and 112d configured to prevent at least a portion of the output illumination 115 from being redirected back into the pump modules 110a, 110b, 110c, and 110d. The one or more blocking filters 112 can prevent output illumination 115 generated by the plasma 104 from coupling back into the one or more pump modules 110 and causing performance degradation, for example, due to photo-induced or thermal damage. In some embodiments, a blocking filter 112 may include a reflective dichroic filter configured to transmit one or more wavelengths of pump illumination 107 and reflect plasma radiation or configured to transmit plasma radiation and reflect pump illumination 107. Alternatively or additionally, a blocking filter 112 may include an absorptive filter (e.g., a gold-coated mirror that efficiently absorbs UV or another selected spectral range). In some embodiments, the blocking filter 112 is configured to transmit pump illumination 107 toward the plasma 104 and is configured to block (e.g., reflect) at least a portion of the output illumination 115 (e.g., broadband plasma radiation) so that it does not reach the pump module 110. In other embodiments, the blocking filter 112 is configured to reflect pump illumination 107 (e.g., to direct the pump illumination 107 toward the plasma 104), and the blocking filter 112 is configured to transmit at least a portion of the output illumination 115 (e.g., broadband plasma radiation) so that it does not reach the pump module 110.

FIGS. 1A through 1C illustrate embodiments of a system 100 for generating and/or maintaining a plasma 104 (e.g., LSP) with pump illumination 107 generated by the one or more pump modules 110. However, it is noted that the embodiments shown in FIGS. 1A through 1C are provided as examples of possible implementations, and the system 100 can also be implemented in accordance with any LSP light source configuration known in the art. Furthermore, the one or more pump modules 110 described herein can be implemented in any other LSP system architecture without departing from the scope of this disclosure.

Referring generally to FIGS. 1A through 1C, in embodiments, the system 100 includes a plasma site 102 (e.g., for generating, or maintaining, a plasma 104). The plasma site 102 may include, but is not limited to, a plasma cell, plasma bulb, chamber, drum, or the like. The plasma site 102 can be configured to contain or support plasma forming material 103 (e.g., a gas or gas mixture and/or liquid or solid plasma forming material). Focusing pump illumination 107 from the one or more pump modules 110 onto/into the plasma forming material 103 may cause energy to be absorbed through one or more selected absorption lines of the plasma forming material 103 or plasma 104 at the plasma site 102, thereby "pumping" the plasma forming material 103 in order to generate or sustain plasma 104. In some embodiments, although not shown, the plasma site 102 may include a set of electrodes for initiating the plasma 104 within the internal volume of the plasma site 102, whereby the pump illumination 107 from the one or more pump modules 110 maintains the plasma 104 after ignition by the electrodes. The plasma 104 may emit broadband illumination, for example, upon relaxation of gas species to a lower energy level.

In some embodiments, excimers may form within the volume of gas outside of the generated plasma 104 at temperatures suitable for generating and/or maintaining a bound excimer state (e.g., a bound molecular state associated with one or more components of the plasma forming material 103) representing an excited energy state of the molecule. Excimers may emit illumination in the ultraviolet spectrum upon relaxation (e.g., de-excitation, or the like) to a lower energy state of the excimer. De-excitation of an excimer may result in a dissociation of the excimer molecule. For example, $Ar_2^*$ excimers may emit at 126 nm, $Kr_2^*$ excimers may emit at 146 nm, and $Xe_2^*$ excimers may emit at 172 nm or 175 nm. It is noted that the spectral content of illumination emanating from the plasma site 102 may include spectral components associated with emission from the plasma 104 and/or one or more excimers within the plasma site 102.

In some embodiments, the system 100 includes one or more propagation elements configured to direct and/or process illumination emitted from the plasma site 102. For example, the one or more propagation elements may include, but are not limited to, transmissive elements (e.g., transparent portions of the plasma site 102, filters, and the like), reflective elements (e.g., mirrors to direct the broadband illumination 115, and the like), or focusing elements (e.g., illumination optics 119, collection optics 123, lenses, focusing mirrors, and the like).

It is noted herein that broadband illumination 115 of plasma illumination is generally influenced by a multitude of factors including, but not limited to, the focused intensity of pump illumination 107 from the one or more pump modules 110, the temperature of the plasma forming material 103, the pressure of the plasma forming material 103, and/or the composition of the plasma forming material 103. Further, spectral content of broadband illumination 115 emitted by the plasma 104 and/or the plasma forming material 103 (e.g. one or more excimers within the plasma site 102) may include, but is not limited to, infrared (IR), visible (VIS), ultraviolet (UV), vacuum ultraviolet (VUV), deep ultraviolet (DUV), or extreme ultraviolet (EUV) wavelengths. In an embodiment, the plasma 104 emits visible and IR illumination with wavelengths in at least the range of 600 to 2000 nm. In another embodiment, the plasma 104 emits visible and UV illumination with wavelengths in at least the range of 200 to 600 nm. In another embodiment, the plasma 104 emits at least short-wavelength illumination having a wavelength below 200 nm. In a further embodiment, one or more excimers in the plasma site 102 emit UV and/or VUV illumination. It is noted herein that the present disclosure is not limited to the wavelength ranges described above and the plasma 104 and/or excimers in the plasma site 102 may emit illumination having wavelengths in one or any combination of the ranges provided above.

It is contemplated herein that the system 100 may be utilized to initiate and/or sustain a plasma 104 using a variety of plasma forming materials 103. In an embodiment, the plasma forming material 103 used to initiate and/or maintain the plasma 104 may include a noble gas, an inert gas (e.g., noble gas or non-noble gas) and/or a non-inert gas (e.g., mercury). In another embodiment, the plasma forming material 103 includes a mixture of a gas (e.g., noble gas, non-noble gases and the like) and one or more gaseous trace materials (e.g., metal halides, transition metals and the like). For example, gases suitable for implementation in the present disclosure may include, but are not limited to, Xe, Ar, Ne, Kr, He, $N_2$, $H_2O$, $O_2$, $H_2$, $D_2$, $F_2$, $CH_4$, metal halides, halogens, Hg, Cd, Zn, Sn, Ga, Fe, Li, Na, K, Tl, In, Dy, Ho, Tm, ArXe, ArHg, ArKr, ArRn, KrHg, XeHg, and the like. In a general sense, the present disclosure should be interpreted to extend to any LSP system and any type of gas mixture suitable for sustaining a plasma 104 at or within a plasma site 102.

The plasma site 102 may include any type of plasma site 102 known in the art suitable for initiating and/or maintaining a plasma 104. For example, in an embodiment, the plasma site 102 includes a plasma cell. The use of a plasma cell is described in at least U.S. Pat. No. 9,775,226, granted on Sep. 26, 2017; and U.S. Pat. No. 9,185,788, granted on Nov. 10, 2015, which are each incorporated herein by reference in the entirety. In another embodiment, the plasma site 102 includes a plasma bulb. The use of a plasma bulb is described in at least in U.S. Pat. No. 7,786,455, granted on Aug. 31, 2010; and U.S. Pat. No. 9,318,311, granted on Apr. 19, 2016, which are each incorporated herein by reference in the entirety.

It is noted herein that the various optical elements (e.g., illumination optics 119, collection optics 123; and the like) may also be enclosed within the plasma site 102. In an embodiment, the plasma site 102 is a chamber suitable for containing a plasma forming material 103 and one or more optical components. For example, the use of a self-contained gas chamber is described in U.S. Pat. No. 9,099,292, granted on Aug. 4, 2015, which is incorporated herein by reference in the entirety.

In some embodiments, the plasma site 102 (e.g., plasma cell plasma bulb, chamber and the like) includes one or more transparent portions. The transparent portions can be formed from any material known in the art that is at least partially transparent to illumination generated by plasma 104. In an embodiment, the transparent portions may be formed from any material known in the art that is at least partially transparent to IR illumination, visible illumination, and/or UV illumination 107 from the one or more pump modules 110. In another embodiment, the transparent portions may be formed from any material known in the art that is at least partially transparent to the broadband illumination 115 emitted from the plasma 104. In an embodiment, a plasma site 102 contains a plasma forming material 103 including one or more gas components to suppress wavelengths of illumination corresponding to an absorption spectrum of any of the transparent portions of the plasma site 102. With regard to this embodiment, benefits of the inhibition of undesired wavelengths by the plasma forming material 103 may include, but are not limited to, reduced damage, reduced solarization, or reduced heating of the transparent portion of the plasma site 102.

In some embodiments, the transparent portions of the plasma site 102 may be formed from a low-OH content fused silica glass material. In other embodiments, the transparent portions of the plasma site 102 may be formed from high-OH content fused silica glass material. For example, the transparent portion of the plasma site 102 may include, but is not limited to, SUPRASIL 1, SUPRASIL 2, SUPRASIL 300, SUPRASIL 310, HERALUX PLUS, HERALUX-VUV, and the like. In other embodiments, the transparent portion of the plasma site 102 may include, but is not limited to, $CaF_2$, $MgF_2$, LiF, crystalline quartz and sapphire. It is noted herein that materials such as, but not limited to, $CaF_2$, $MgF_2$, crystalline quartz and sapphire provide transparency to short-wavelength illumination (e.g., $\lambda<190$ nm). Various glasses suitable for implementation in the transparent portion of the plasma site 102 (e.g., chamber window, glass bulb, glass tube or transmission element) of the present disclosure are discussed in detail in A. Schreiber et al., Illumination Resistance of Quartz Glass for VUV Discharge Lamps, J. Phys. D: Appl. Phys. 38 (2005), 3242-3250, which is incorporated herein by reference in the entirety. It is noted herein that fused silica does provide some transparency to illumination having wavelength shorter than 190 nm, showing useful transparency to wavelengths as short as 170 nm.

The one or more transparent portions of the plasma site 102 may take on any shape known in the art. In an embodiment, the transparent may have a cylindrical shape. In another embodiment, the transparent portion may have a spherical shape. In another embodiment, the transparent portion may have a composite shape. For example, the shape of the transparent portion may comprise a combination of two or more shapes.

In some embodiments, the system 100 may include a collector element (e.g., an ellipsoidal or a spherical collector element) configured to focus illumination emanating from the one or more pump modules 110 into a volume of a plasma forming material 103 contained within the plasma site 102. In embodiments, the collector element is arranged to collect broadband illumination 115 emitted by plasma 104 and direct the broadband illumination 115 to one or more additional optical elements (e.g., collection optics 123, one or more filters, homogenizer 125, and the like). It is noted that the above configuration is not a limitation on the scope of the present disclosure. For example, the system 100 may include one or more reflector and/or focus optics for focusing and/or directing illumination from one or more pump modules 110 into the volume of the plasma forming material 103 and a separate set of collection optics for collecting broadband illumination 115 emitted by the plasma 104. For example, an optical configuration including separate reflector optics and collection optics is described in U.S. Patent Publication No. 2016/0381776, published on Dec. 29, 2016, which is incorporated herein by reference in the entirety.

The collector element may take on any physical configuration known in the art suitable for focusing illumination emanating from the one or more pump modules 110 into or onto the plasma forming material 103. In some embodiments, the collector element may include a concave region with a reflective internal surface suitable for receiving illumination 107 from the one or more pump modules 110 and focusing the illumination 107 into the volume of plasma forming material 103 contained within the plasma site 102. For example, the collector element may include an ellipsoid-shaped collector element having a reflective internal surface. As another example, the collector element may include a spherical-shaped collector element having a reflective internal surface.

In some embodiments, a collector element collects broadband illumination 115 emitted by plasma 104 and directs the broadband illumination 115 to one or more downstream optical elements. For example, the one or more downstream optical elements may include, but are not limited to, collection optics 123 (e.g., focusing elements, filters, etc.), a homogenizer 125, and the like. In some embodiments, the collector element may collect broadband illumination 115 including EUV, DUV, VUV, UV, visible and/or infrared illumination emitted by plasma 104 and direct the broadband illumination to one or more downstream optical elements. In this regard, the plasma site 102 may deliver EUV, DUV, VUV, UV, visible, and/or infrared illumination to downstream optical elements of any optical characterization system known in the art, such as, but not limited to, an inspection tool or a metrology tool. For example, the LSP system 100 may serve as an illumination sub-system, or illuminator, for a broadband inspection tool (e.g., wafer or reticle inspection tool), a metrology tool or a photolithography tool. It is noted herein the plasma site 102 of system 100 may emit useful illumination in a variety of spectral ranges including, but not limited to, EUV, DUV illumination, VUV illumination, UV illumination, visible illumination, and infrared illumination.

In some embodiments, the system 100 may include various additional optical elements. For example, additional optics may include collection optics configured to collect broadband illumination emanating from the plasma 104. For instance, the system 100 may include a cold mirror 121 (e.g. operating as a beam splitter, a sampler, or the like) arranged to direct illumination from a collector element to downstream optics, such as, but not limited to, a homogenizer 125.

In some embodiments, the system 100 may include one or more additional lenses placed along either the illumination pathway or the collection pathway of system 100. The one or more lenses may be utilized to focus illumination from the one or more pump modules 110 into the volume of plasma forming material 103. Alternatively, the one or more additional lenses may be utilized to focus broadband illumination emitted by the plasma 104 onto a selected target (not shown).

It is noted herein that the set of optics of system 100 as described above and illustrated in FIGS. 1A through 1C are provided for illustration and should not be interpreted as limiting. It is contemplated that a number of equivalent optical configurations may be utilized within the scope of the present disclosure.

A limitation of LSP light source performance is plasma growth at higher operation of power. For example, FIGS. 2A-2D illustrate example images of an LSP pumped at different laser powers with a conventional pump module with low numerical aperture (NA), such as in the system illustrated in FIG. 1A, in accordance with one or more embodiments of the present disclosure.

As shown in FIG. 2A, example image 200 shows a collection region 202 of LSP pumped with 150 W of laser power via a conventional pump module with a NA of 0.3 (with near-Gaussian power distribution in the NA space). As shown in FIG. 2B, example image 210 shows the collection region 202 of LSP pumped with 250 W of laser power via a conventional pump module with a NA of 0.3 (with near-Gaussian power distribution in the NA space). As shown in FIG. 2C, example image 220 shows the collection region 202 of LSP pumped with 500 W of laser power via a conventional pump module with a NA of 0.3 (with near-Gaussian power distribution in the NA space). As shown in FIG. 2D shows an example image 230 shows the collection region 202 of LSP pumped with 1000 W of laser power via a conventional pump module with a NA of 0.3 (with near-Gaussian power distribution in the NA space).

FIGS. 2A-2D generally illustrate an increase in plasma size in the direction of the pump laser beam 204 as the power of the laser increases (e.g., 150 W in FIG. 2A to 1000 W in FIG. 2D). As the plasma size increases, the plasma absorbs the pump laser power in the periphery thus preventing delivery of the laser power to the plasma center. In order to obtain brighter, higher temperature plasma in the focus, the pump laser intensity at the focus must increase. In a low-power regime, the pump laser intensity may be increased by increasing the pump laser power. However, in a high-power regime, the plasma starts to grow, resulting in the pump laser being absorbed further and further away from the laser focus since the pump has to propagate through warm absorbing plasma. In this regard, the plasma size increases while the maximum radiance stays substantially constant and eventually starts to decrease, thus limiting the maximum plasma radiance.

One difficulty in a pulsed pump regime is the duty cycle. In order to obtain comparable performance, pulsed laser average power should be comparable to CW. In the pulsed regime, however, this power is delivered in short bursts. Instantaneous power in the pulsed regime is manifold higher than in the CW regime. In turn, the plasma instantaneous radiance should be much higher compared to the CW regime in order to compensate for the duty cycle. Thus, plasma performance is driven by somewhat different processes (as shown in FIG. 3A-5C). For example, the plasma laser repetition rate may be much smaller than the cool down time for the plasma (e.g., system 300 in FIG. 3A). By way of another example, the plasma repetition rate may be much larger than the cool down time of the plasma (e.g., system 400, 500 in FIGS. 4A, 5A respectively). For instance, the plasma may be shorter than it takes for the plasma to expand beyond the collection region (e.g., system 400 of FIG. 4A).

Figure 5B:
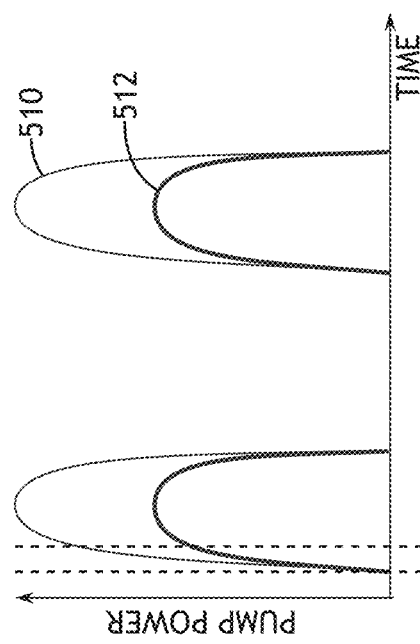
FIG. 5B is an example of a graphical plot of the pump power for low-repetition rate long-pulse illumination inside a collection volume of the LSP illustrated in FIG. 5A and outside the collection volume of the LSP illustrated in FIG. 5A, in accordance with one or more embodiments of the present disclosure.
Figure 5C:
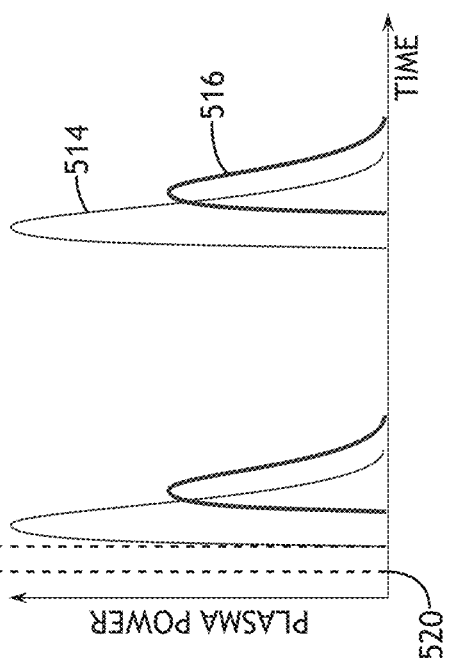
FIG. 5C is an example of a graphical plot of the plasma emissivity inside a collection volume of the LSP illustrated in FIG. 5A and outside the collection volume of the LSP illustrated in FIG. 5A, in accordance with one or more embodiments of the present disclosure.
Figure 5A:
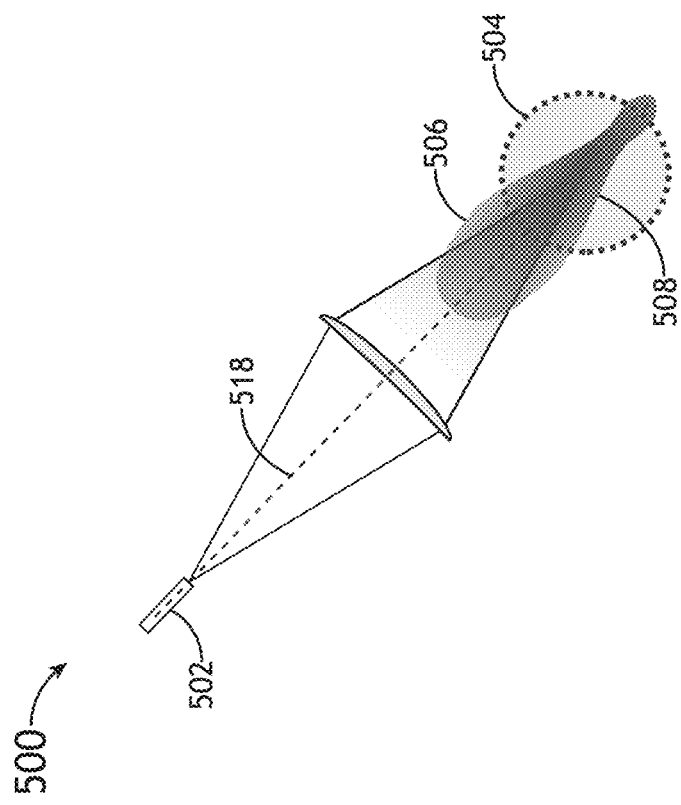
FIG. 5A illustrates plasma growth of LSP pumped with low-repetition rate long-pulse illumination, in accordance with one or more embodiments of the present disclosure.

In another instance, the plasma may be longer than it takes for the plasma to expand beyond the collection region (e.g., system 500 of FIG. 5A).

Figure 3B:
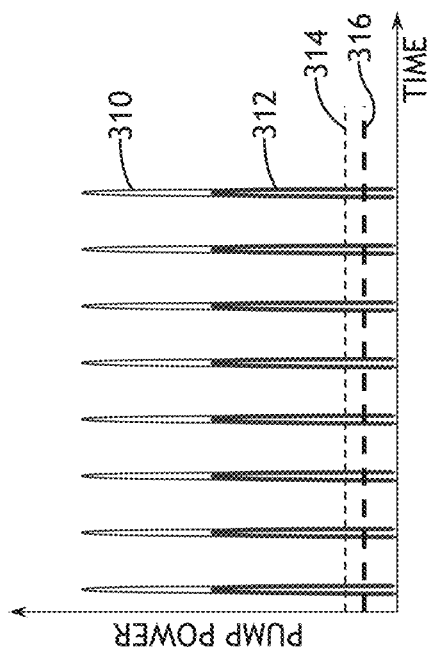
FIG. 3B is an example of a graphical plot of the pump power for CW or high-repetition rate pulsed illumination inside a collection volume of the LSP illustrated in FIG. 3A and outside the collection volume of the LSP illustrated in FIG. 3A, in accordance with one or more embodiments of the present disclosure.
Figure 3C:
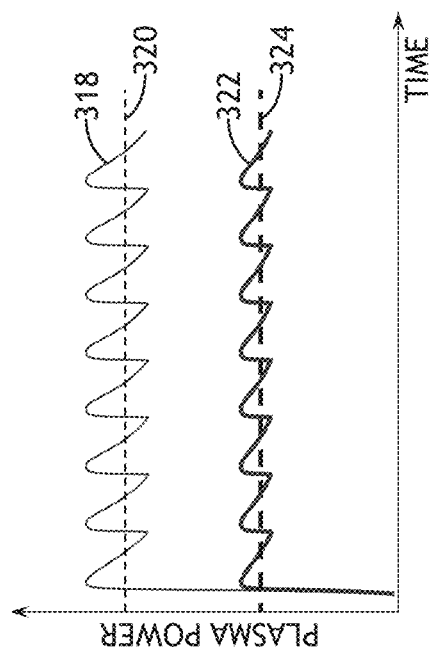
FIG. 3C is an example of a graphical plot of the plasma emissivity inside a collection volume of the LSP illustrated in FIG. 3A and outside the collection volume of the LSP illustrated in FIG. 3A, in accordance with one or more embodiments of the present disclosure.
Figure 3A:
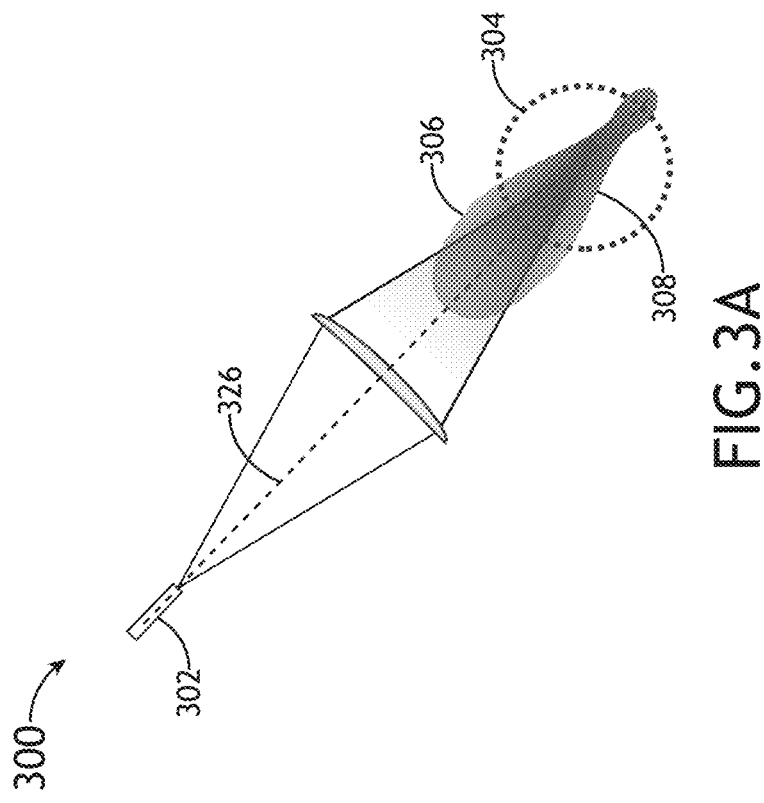
FIG. 3A illustrates plasma growth of LSP pumped with continuous wave (CW) or high-repetition rate pulsed illumination, in accordance with one or more embodiments of the present disclosure.

FIG. 3A illustrates plasma growth of LSP pumped with continuous wave (CW) or high-repetition rate pulsed illumination, in accordance with one or more embodiments of the present disclosure. In embodiments, a system 300 may include a pump laser 302 configured to emit pump illumination 326. In system 300, plasma growth of LSP pumped with the pump illumination 326 occurs inside 308 a collection volume 304 and outside 306 of the collection volume 304.

FIG. 3B is an example of a graphical plot of the pump power for CW or high-repetition rate pulsed illumination inside a collection volume of the LSP illustrated in FIG. 3A and outside the collection volume of the LSP illustrated in FIG. 3A, in accordance with one or more embodiments of the present disclosure. The pump power for CW regimes inside the collection volume 314 is greater than the pump power for CW outside the collection volume 316. The pump power for high-repetition-rate pulse regimes inside the collection volume 310 is greater than the pump power for high-repetition-rate pulse regimes outside the collection volume 312.

FIG. 3C is an example of a graphical plot of the plasma emissivity inside a collection volume of the LSP illustrated in FIG. 3A and outside the collection volume of the LSP illustrated in FIG. 3A, in accordance with one or more embodiments of the present disclosure. The plasma emissivity for CW regimes inside the collection volume 320 is greater than the plasma emissivity for CW outside the collection volume 324. The plasma emissivity for high-repetition-rate pulse regimes inside the collection volume 318 is greater than the plasma emissivity for high-repetition-rate pulse regimes outside the collection volume 322.

A limitation of system 300 is that the plasma would not have time to cool down before the arrival of the next pump pulse. For example, typical times of plasma cooldown is about 300 ns. Thus, repetition frequencies of more than about a 10 MHz (with the pulse duration of less than about 1 ns for a duty cycle of 1:100 or less, pulse energy of about 1 mJ or less for 10 kW operation) would result in a plasma that has almost the same properties as CW.

FIG. 4A illustrates plasma growth of LSP pumped with low-repetition rate short-pulse illumination, in accordance with one or more embodiments of the present disclosure. In embodiments, a system 400 may include a pump laser 402 configured to emit pump illumination 412. In system 400, the plasma growth of LSP pumped with the pump illumination 326 occurs solely inside a region 406 of a collection volume 404.

FIG. 4B is an example of a graphical plot of the pump power 408 for low-repetition rate short-pulse illumination inside a collection volume of the LSP illustrated in FIG. 4A, in accordance with one or more embodiments of the present disclosure. FIG. 4C is an example of a graphical plot of the plasma emissivity inside a collection volume of the LSP illustrated in FIG. 4A, in accordance with one or more embodiments of the present disclosure. Due to the poor duty cycle of the pulsed regime, the peak emissivity 410 of the plasma must be higher than in a CW regime in order to match the performance of the CW plasmas (as shown in FIG. 4C). Further, due to the amount of energy deposited in the collection volume 404 in a short time, the instantaneous plasma temperature increases at a higher rate than needed.

A limitation for system 400 is that plasma overheats and there is poor duty cycle. For example, a short-pulse regime is achieved with pulse widths of about 1 ns or shorter. In this regime, all power is delivered near the focus after immediately after the breakdown. Such high peak power delivered to the plasma results in instantaneous plasma temperatures that are much higher than the target 1-5 eV. Plasmas of this kind tend to emit strongly at wavelengths shorter than 100 nm and rapidly cool down by radiation and fast adiabatic expansion, resulting in reduced conversion efficiency. For a typical duty cycle of 1:10000 (10 kHz 10 ns), the peak laser power is about 10000 times higher than in CW case of the same average power (FIGS. 4A through 4C). The peak plasma temperature is thus also many times higher than that in CW case (~10-100 eV pulsed compared to 1-2 eV CW).

FIG. 5A illustrates plasma growth of LSP pumped with low-repetition rate long-pulse illumination, in accordance with one or more embodiments of the present disclosure. In embodiments, a system 500 may include a pump laser 502 configured to emit pump illumination 518. In system 500, the plasma growth of LSP pumped with the pump illumination 518 occurs inside 508 a collection volume 504 and outside 506 the collection volume 504.

FIG. 5B is an example of a graphical plot of the pump power for low-repetition rate long-pulse illumination inside a collection volume of the LSP illustrated in FIG. 5A and outside the collection volume of the LSP illustrated in FIG. 5A, in accordance with one or more embodiments of the present disclosure. The pump power for low-repetition-rate long-pulse regimes inside the collection volume 510 is greater than the pump power for low-repetition-rate long-pulse regimes outside the collection volume 512.

FIG. 5C is an example of a graphical plot of the plasma emissivity inside a collection volume of the LSP illustrated in FIG. 5A and outside the collection volume of the LSP illustrated in FIG. 5A, in accordance with one or more embodiments of the present disclosure. The plasma emissivity for low-repetition-rate long-pulse regimes inside the collection volume 514 is greater than the plasma emissivity for low-repetition-rate long-pulse regimes outside the collection volume 516.

A limitation for system 500 is plasma growth is accelerated by the pump power deposition at the plasma edge. The plasma in the center does not begin until the breakdown pump intensity is achieved. Further, there is a delay 520 for plasma to travel to the outside of the breakdown region (as shown in FIGS. 5B and 5C). The pump power begins before the plasma begins to emit the energy from the pump illumination 518.

Figure 6B:
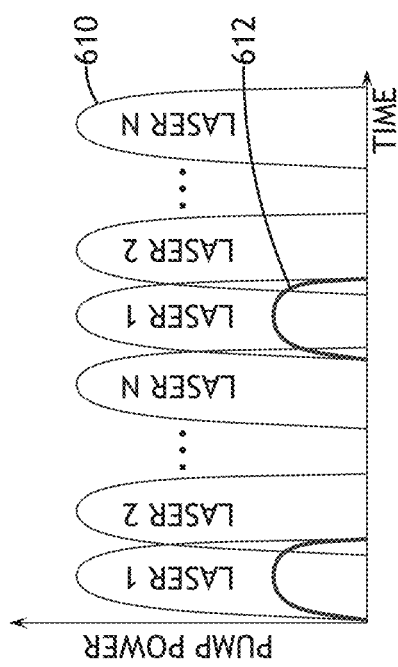
FIG. 6B is an example of a graphical plot of the pump power for interlaced illumination pulses inside a collection volume of the LSP illustrated in FIG. 6A and outside the collection volume of the LSP illustrated in FIG. 6A, in accordance with one or more embodiments of the present disclosure.
Figure 6C:
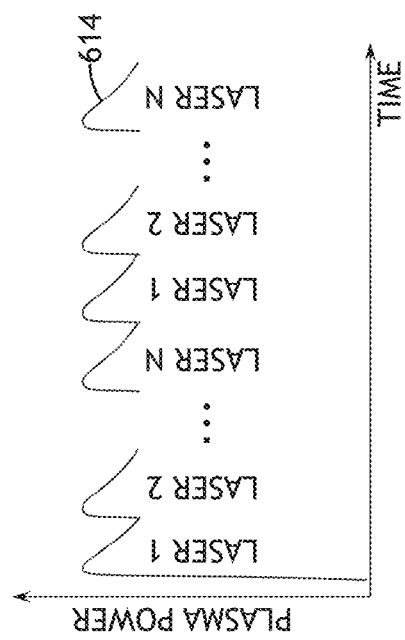
FIG. 6C is an example of a graphical plot of the plasma emissivity inside a collection volume of the LSP illustrated in FIG. 6A and outside the collection volume of the LSP illustrated in FIG. 6A, in accordance with one or more embodiments of the present disclosure.
Figure 6A:
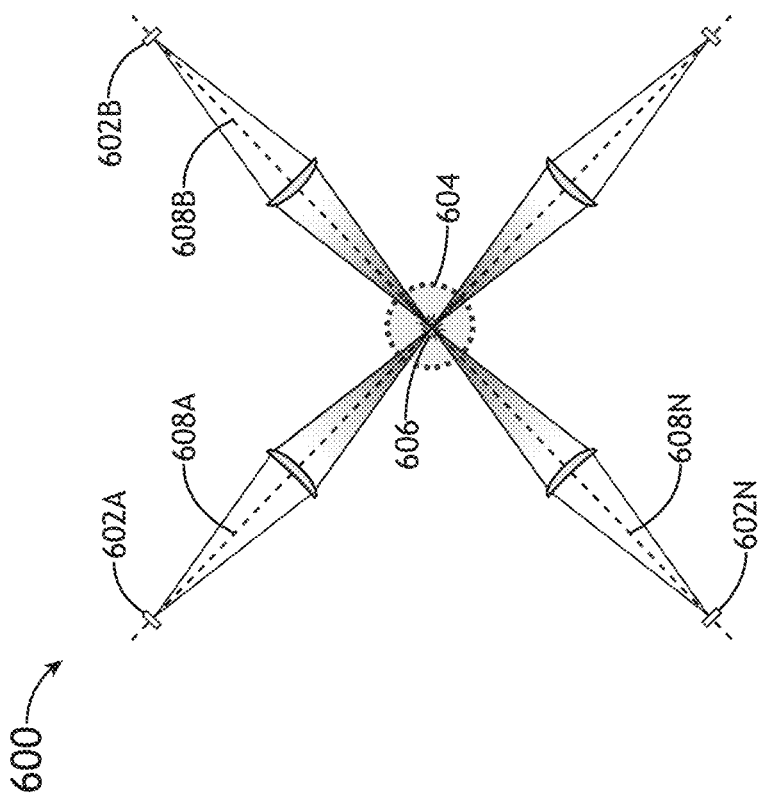
FIG. 6A illustrates plasma growth of LSP pumped by interlaced pulsed illumination sources, in accordance with one or more embodiments of the present disclosure.

FIG. 6A illustrates plasma growth of LSP pumped by interlaced pulsed illumination sources, in accordance with one or more embodiments of the present disclosure. FIG. 6B is an example of a graphical plot of the pump power for interlaced illumination pulses inside a collection volume of the LSP illustrated in FIG. 6A and outside the collection volume of the LSP illustrated in FIG. 6A, in accordance with one or more embodiments of the present disclosure. FIG. 6C is an example of a graphical plot of the plasma emissivity inside a collection volume of the LSP illustrated in FIG. 6A, in accordance with one or more embodiments of the present disclosure.

In embodiments, a system 600 includes one or more pump modules 602 configured to generate respective pulses of pump illumination 608A, 608B, 608N for an LSP 606. For example, the system 600 may include a first pump module 602A, a second pump module 602B, up to an N number of pump modules 602N. At least one pump module 602A, 602B, 602N of the one or more pump modules 602 may be configured to generate at least a train of pump pulses that is interlaced in time with another train of pump pulses generated by at least one other pump module 602A, 602B, 602N of the one or more pump modules 602. For example, a first train of pump pulses generated by the first pump module 602A may interlace in time with a second train of pump pulses generated by the second pump module 602B. By way of another example, a first train pump, a second train pump, a third train pump, and a fourth train pump may be interlaced respectively.

It is contemplated herein that the arrangement of the pump modules shown in FIG. 6A shall not be construed as limiting the scope of the present disclosure. For example, the system 600 may include any number of pump modules 602. By way of another example, the one or more pump modules 602 may be positioned in any arrangement.

In embodiments, the system 600 includes a plurality of non-collinear paths configured to direct the respective pulses of pump illumination from the one or more pump modules 602 into a collection volume 604 of the LSP 606. In some embodiments, the plurality of non-collinear illumination paths are non-overlapping outside the collection volume 604. In another embodiment, the plurality of non-collinear illumination paths overlap at or near a center of the collection volume 604, as shown in FIG. 6A.

In some embodiments, as shown in FIG. 6A, the plurality of non-collinear illumination paths may be configured to direct the respective pulses of pump illumination into the collection volume 604 from different directions.

In some embodiments, respective focal spots of the one or more pump modules 602 may be positioned at different locations in space.

In some embodiments, the total pump power delivered to the collection volume 604 may be the sum of individual pump powers delivered to the collection volume 604 by individual pump modules of the one or more pump modules 602. Since each train of pump pulses (e.g., 608 in FIG. 6B) are interlaced (e.g., 610 in FIG. 6B) in time with other train of pump pulses generated by the one or more pump modules 602, the pump pulse repetition rate inside the collection volume 604 may be higher than a repetition rate of an individual pump module of the one or more pump modules 602. For example, the pump pulse repetition rate inside the collection volume 604 may be at least 1/t, where t is a cool-down time of the LSP 606.

Outside of the collection volume the degree of overlap between the non-collinear illumination paths may be small. The pulse width of the individual pump module of the one or more pump modules 602 may be at least t/n, where t is a cool-down time of the LSP 606 and n is the number of pump modules 602N.

In some embodiments, the system 600 includes at least one pump module configured to generate continuous wave (CW) pump illumination for the LSP 606. The at least one additional pump module may be configured to maintain the LSP 606 with the CW pump illumination when a pump pulse repetition rate inside the collection volume 604 is less than 1/t, where t is the cool-down time of the LSP 606.

Given the plasma cool-down time of 300 ns and ten pump channels, the required laser repetition frequency should be about 3 MHz. In order for the pulses to overlap in the plasma center, their duration should be about 30 ns. For a 30 kW system, pulse energy is 10 mJ. For this operation, the size of the brightest volume should be about 0.3 mm—similar for a CW plasma size operating at 5 kW and much smaller than 30 kW CW plasma of the size of more than about 1 mm. Thus, six times higher power can be delivered to the plasma center.

It is contemplated herein that the system 600 offers a number of improvements over known systems. First, system 600 allows delivery of the pump laser power to the central part of the plasma (e.g., the collection volume) without loss by absorption of the plasma outside the collection volume 614 (e.g., as illustrated in FIG. 6B where the plasma emissivity 612 inside the collection volume is shown). By the time the next pulse arrives from the one or more pump modules, the plasma formed in its path by the previous pulse has already cooled down and does not absorb the pump power. In the center of the plasma, it is sustained in a CW-like manner and thus is not limited by the duty cycle of standard pulsed arrangements. Each of the laser pulses propagates to the collection volume without plasma absorption since the repetition rate for each of the one or more pump modules is lower and the plasma has time to cool down on their path. Inside the collection volume, pump laser pulses from different one or more pump modules interlace maintaining pump power intensity that sustains CW plasma.

Second, since the plasma is always present inside the collection volume, the leading edge of each pulse if efficiently absorbed by the plasma. In low-repetition-rate pulsed operation, the leading edge of the pump pulse passes through the collection volume without absorption until the breakdown occurs.

Third, the size of the plasma may be reduced, in comparison to CW pump, thus making LSP more efficient and achieving higher collectable radiance.

Figure 7:
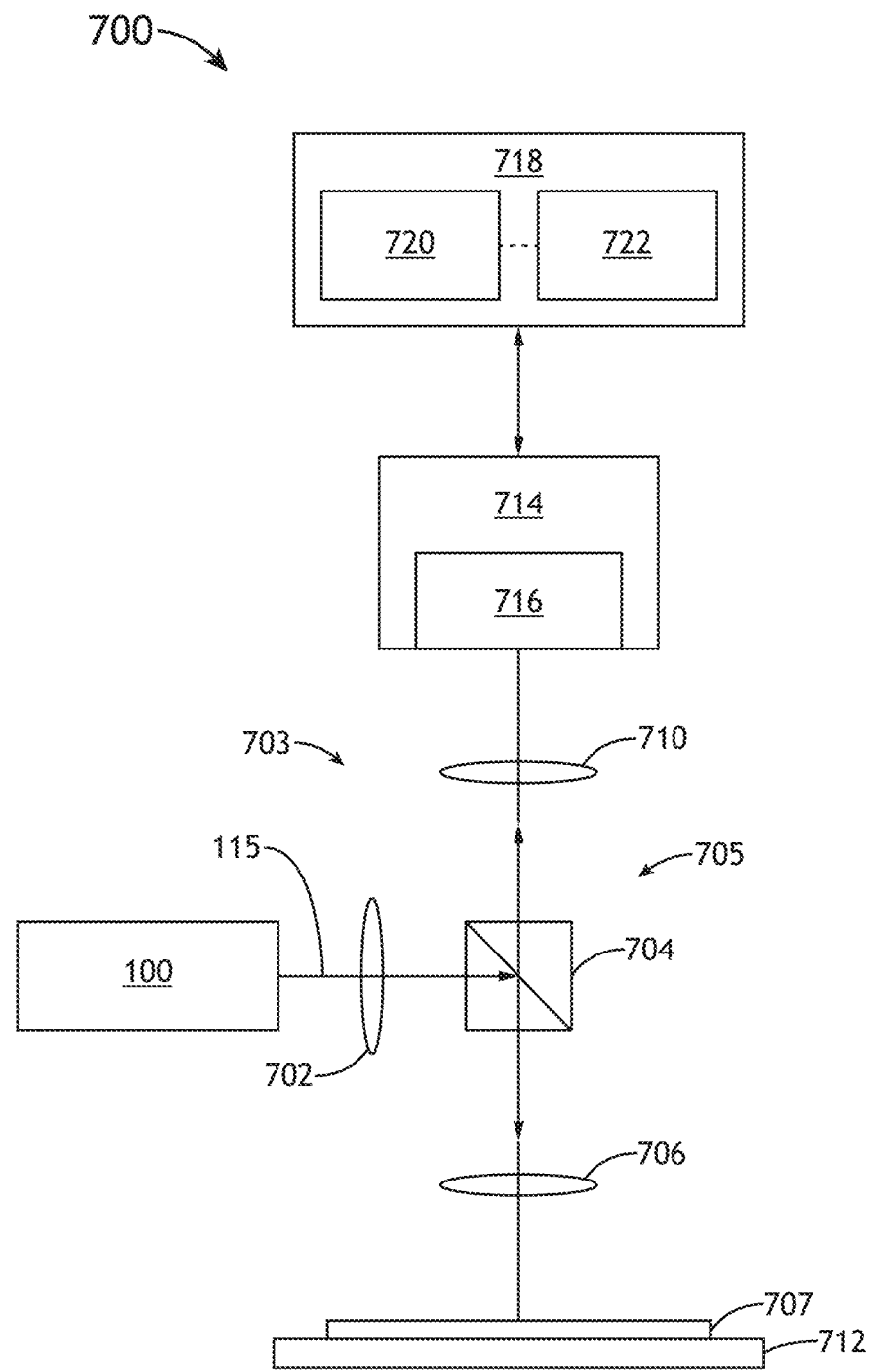
FIG. 7 is schematic illustration of an optical characterization system implementing an LSP illumination source, such as the LSP illumination system illustrated in any of FIGS. 1A through 6C, or any combination thereof, in accordance with one or more embodiments of the present disclosure.

FIG. 7 illustrates a simplified schematic view of an optical characterization system 700 implementing the LSP illumination system 100, in accordance with one or more embodiments of the present disclosure. In one embodiment, system 700 includes the LSP illumination system 100, an illumination arm 703, a collection arm 705, a detector assembly 714, and a controller 718 including one or more processors 720 and memory 722.

It is noted herein that system 700 may comprise any imaging, inspection, metrology, lithography, or other characterization system known in the art. In this regard, system 700 may be configured to perform inspection, optical metrology, lithography, and/or any form of imaging on a specimen 707. Specimen 707 may include any sample known in the art including, but not limited to, a wafer, a reticle/photomask, or the like. It is noted that system 700 may incorporate one or more of the various embodiments of the LSP illumination system 100 described throughout the present disclosure.

In one embodiment, specimen 707 is disposed on a stage assembly 712 to facilitate movement of specimen 707. Stage assembly 712 may include any stage assembly 712 known in the art including, but not limited to, an X-Y stage, an R-θ stage, or the like. In another embodiment, stage assembly 712 is capable of adjusting the height of specimen 707 during inspection or imaging to maintain focus on the specimen 707.

In another embodiment, the illumination arm 703 is configured to direct illumination 115 from the LSP illumination system 100 to the specimen 707. The illumination arm 703 may include any number and type of optical components known in the art. In one embodiment, the illumination arm 703 includes one or more optical elements 702, a beam splitter 704, and an objective lens 706. In this regard, illumination arm 703 may be configured to focus illumination 115 from the LSP illumination system 100 onto the surface of the specimen 707. The one or more optical elements 702 may include any optical element or combination of optical elements known in the art including, but not limited to, one or more mirrors, one or more lenses, one or more polarizers, one or more gratings, one or more filters, one or more beam splitters, and the like.

In another embodiment, the collection arm 705 is configured to collect light reflected, scattered, diffracted, and/or emitted from specimen 707. In another embodiment, collection arm 705 may direct and/or focus the light from the specimen 707 to a sensor 716 of a detector assembly 714. It is noted that sensor 716 and detector assembly 714 may include any sensor and detector assembly known in the art. The sensor 716 may include, but is not limited to, a charge-coupled device (CCD) detector, a complementary metal-oxide semiconductor (CMOS) detector, a time-delay integration (TDI) detector, a photomultiplier tube (PMT), an avalanche photodiode (APD), and the like. Further, sensor 716 may include, but is not limited to, a line sensor or an electron-bombarded line sensor.

In another embodiment, detector assembly 714 is communicatively coupled to a controller 718 including one or more processors 720 and memory 722. For example, the one or more processors 720 may be communicatively coupled to memory 722, wherein the one or more processors 720 are configured to execute a set of program instructions stored on memory 722. In an embodiment, the one or more processors 720 are configured to analyze the output of detector assembly 714. In another embodiment, the set of program instructions are configured to cause the one or more processors 720 to analyze one or more characteristics of specimen 707. In another embodiment, the set of program instructions are configured to cause the one or more processors 720 to modify one or more characteristics of system 700 in order to maintain focus on the specimen 707 and/or the sensor 716. For example, the one or more processors 720 may be configured to adjust the objective lens 706 or one or more optical elements 702 in order to focus illumination 115 from LSP illumination system 100 onto the surface of the specimen 707. By way of another example, the one or more processors 720 may be configured to adjust the objective lens 706 and/or one or more optical elements 710 in order to collect illumination from the surface of the specimen 707 and focus the collected illumination on the sensor 716.

It is noted that the system 700 may be configured in any optical configuration known in the art including, but not limited to, a dark-field configuration, a bright-field orientation, or the like.

It is noted herein that the one or more components of system 100 and/or system 700 may be communicatively coupled to the various other components of system 100 and/or system 700 in any manner known in the art. For example, the LSP illumination system 100, detector assembly 714, controller 718, and one or more processors 720 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Figure 8:
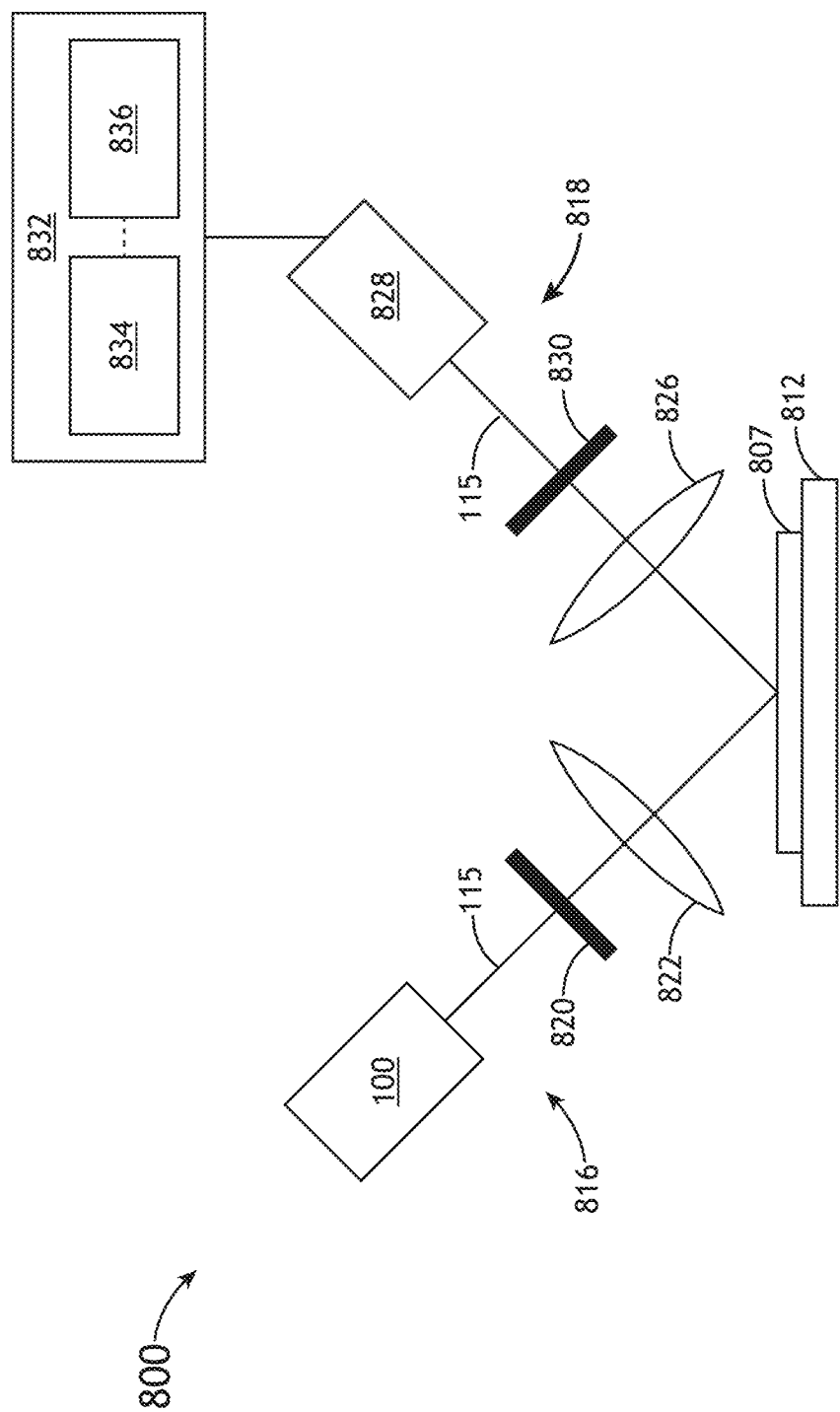
FIG. 8 is a schematic illustration of an optical characterization system implementing an LSP illumination source, such as the LSP illumination system illustrated in any of FIGS. 1A through 6C, or any combination thereof, in accordance with one or more embodiments of the present disclosure.

FIG. 8 illustrates a simplified schematic diagram of an optical characterization system 800 arranged in a reflectometry and/or ellipsometry configuration, in accordance with one or more embodiments of the present disclosure. It is noted that the various embodiments and components described with respect to the system 700 illustrated in FIG. 7 may be interpreted to extend to the system 800 illustrated in FIG. 8. Furthermore, the system 800 may include any type of metrology system known in the art.

In an embodiment, system 800 includes the LSP illumination system 100, an illumination arm 816, a collection arm 818, a detector assembly 828, and a controller 832 including one or more processors 834 and memory 836.

In this embodiment, the broadband illumination 115 from the LSP illumination source is directed to a specimen 807 via the illumination arm 816. The system 800 may collect illumination emanating from the sample via the collection arm 818. The illumination arm 816 may include one or more beam conditioning components 820 suitable for modifying and/or conditioning the broadband illumination 115. For example, the one or more beam conditioning components 820 may include, but are not limited to, one or more polarizers, one or more filters, one or more beam splitters, one or more diffusers, one or more homogenizers, one or more apodizers, one or more beam shapers, or one or more lenses.

In embodiments, the illumination arm 816 may utilize a first focusing element 822 to focus and/or direct the illumination 115 onto the specimen 807 disposed on the sample stage 812. The collection arm 818 may include a second focusing element 826 to collect illumination from the specimen 807.

In embodiments, the detector assembly 828 is configured to capture illumination emanating from the specimen 807 through the collection arm 818. For example, the detector assembly 828 may receive illumination reflected or scattered (e.g., via specular reflection, diffuse reflection, and the like) from the specimen 807. By way of another example, the detector assembly 828 may receive illumination generated by the specimen 807 (e.g., luminescence associated with absorption of the illumination 115, and the like). It is noted that detector assembly 828 may include any sensor and detector assembly known in the art. The sensor may include, but is not limited to, CCD detector, a CMOS detector, a TDI detector, a PMT, an APD, and the like.

The collection arm 818 may further include any number of collection beam conditioning elements 830 to direct and/or modify illumination collected by the second focusing element 826 including, but not limited to, one or more lenses, one or more filters, one or more polarizers, or one or more phase plates.

The system 800 may be configured as any type of metrology tool known in the art such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), an imaging system, a pupil imaging system, a spectral imaging system, or a scatterometer.

Descriptions of inspection/metrology tools suitable for implementation in the various embodiments of the present disclosure are provided in U.S. Pat. No. 7,957,066, entitled "Split Field Inspection System Using Small Catadioptric Objectives," issued on Jun. 7, 2011; U.S. Pat. No. 7,345,825, entitled "Beam Delivery System for Laser Dark-Field Illumination in a Catadioptric Optical System," issued on Jan. 4, 2007; U.S. Pat. No. 5,999,310, entitled "Ultra-broadband UV Microscope Imaging System with Wide Range Zoom Capability," issued on Dec. 7, 1999; U.S. Pat. No. 7,525,649 entitled "Surface Inspection System Using Laser Line Illumination with Two Dimensional Imaging," issued on Apr. 28, 2009; U.S. Pat. No. 9,228,943, entitled "Dynamically Adjustable Semiconductor Metrology System," by Wang et al. and issued on Jan. 5, 2016; U.S. Pat. No. 5,608,526, entitled "Focused Beam Spectroscopic Ellipsometry Method and System, by Piwonka-Corle et al., issued on Mar. 4, 1997; and U.S. Pat. No. 6,297,880, entitled "Apparatus for Analyzing Multi-Layer Thin Film Stacks on Semiconductors," by Rosencwaig et al., issued on Oct. 2, 2001, which are each incorporated herein by reference in their entirety.

The one or more processors 720/834 of the present disclosure may include any processing elements known in the art. In this sense, the one or more processors 720/834 may include any microprocessor-type device configured to execute software algorithms and/or instructions. It should be recognized that the steps described throughout the present disclosure may be carried out by a single computer system or, alternatively, multiple computer systems. In general, the term "processor" may be broadly defined to encompass any device having one or more processing and/or logic elements, which execute program instructions from a non-transitory memory medium 722/836. Moreover, different subsystems of the various systems disclosed may include processor and/or logic elements suitable for carrying out at least a portion of the steps described throughout the present disclosure.

The memory medium 722/836 may include any storage medium known in the art suitable for storing program instructions executable by the associated one or more processors 720/834. For example, the memory medium 722/836 may include a non-transitory memory medium. For instance, the memory medium 722/836 may include, but is not limited to, a read-only memory, a random-access memory, a magnetic or optical memory device (e.g., disk), a magnetic tape, a solid-state drive, and the like. In another embodiment, the memory 722/836 is configured to store one or more results and/or outputs of the various steps described herein. It is further noted that memory 722/836 may be housed in a common controller housing with the one or more processors 720/834. In an alternative embodiment, the memory 722/836 may be located remotely with respect to the physical location of the one or more processors 720/834. For instance, the one or more processors 720/834 may access a remote memory (e.g., server), accessible through a network (e.g., internet, intranet, and the like). In this regard, the one or more processors 720/834 of the controller 718/832 may execute any of the various process steps described throughout the present disclosure.

In some embodiments, the LSP illumination system 100 and systems 700, 800, as described herein, may be configured as a "stand alone tool," interpreted herein as a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in-situ control technique. The parameter of the process or the process tool may be altered manually or automatically.

The embodiments of the LSP illumination system 100 and systems 700, 800 may be further configured as described herein. In addition, the LSP illumination system 100 and systems 700, 800 may be configured to perform any other step(s) of any of the method implementation(s) (e.g., method 900) described herein.

Figure 9:
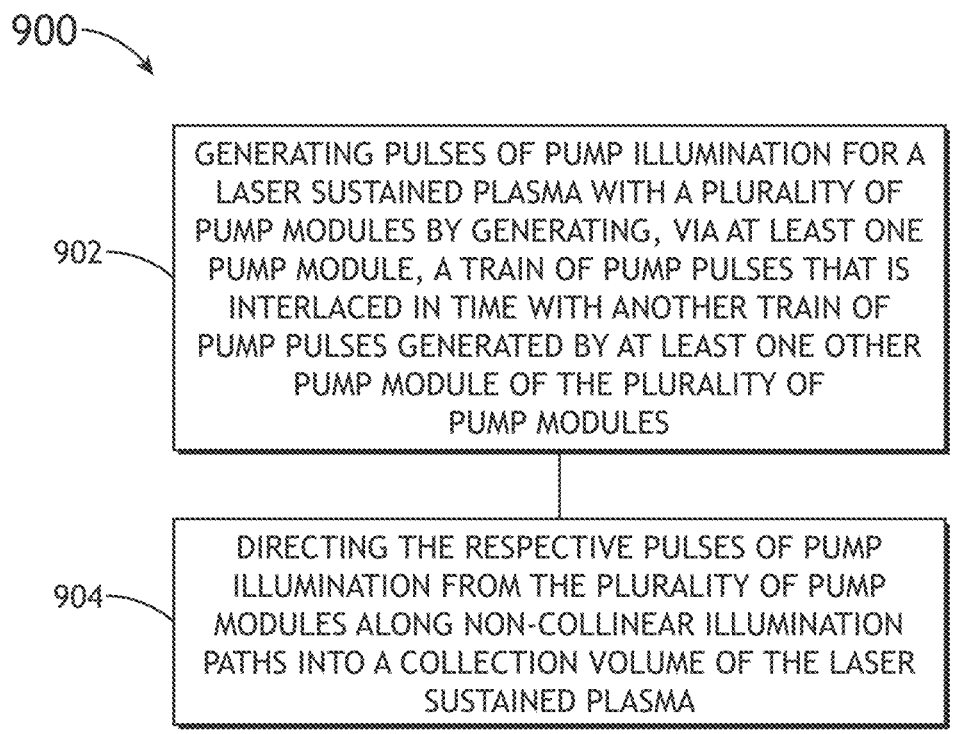
FIG. 9 is a flow diagram illustrating a method of pumping laser sustained plasma, in accordance with one or more embodiments of the present disclosure.

FIG. 9 is flow diagram illustrating a method 900 of pumping (i.e., sustaining) LSP, in accordance with one or more illustrative embodiments of this disclosure. At step 902, the method 900 includes generating pulses of pump illumination for the LSP 104 with a plurality of pump modules 110 (e.g., 110a-110d, etc.) by generating, via at least one pump module, a train of pump pulses that is interlaced in time with another train of pump pulses generated by at least one other pump module of the plurality of pump modules 110. At step 904, the method 900 further includes directing the respective pulses of pump illumination from the plurality of pump modules 110 along non-collinear illumination paths into a collection volume of the LSP 104.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A system for pumping laser sustained plasma, comprising:
    a plurality of pump modules configured to generate respective pulses of pump illumination for the laser sustained plasma, wherein at least one pump module of the plurality of pump modules is configured to generate a train of pump pulses that is interlaced in time with another train of pump pulses generated by at least one other pump module of the plurality of pump modules; and
    a plurality of non-collinear illumination paths configured to direct the respective pulses of pump illumination from the plurality of pump modules into a collection volume of the laser sustained plasma.

2. The system of claim 1, wherein the plurality of non-collinear illumination paths are non-overlapping outside the collection volume.

3. The system of claim 1, wherein the plurality of non-collinear illumination paths overlap at or near a center of the collection volume.

4. The system of claim 1, wherein the plurality of non-collinear illumination paths are configured to direct the respective pulses of pump illumination into the collection volume from different directions.

5. The system of claim 1, wherein respective focal spots of the plurality of pump modules are positioned at different locations in space.

6. The system of claim 1, wherein a total pump power delivered to the collection volume is a sum of individual pump powers delivered to the collection volume by individual pump modules of the plurality of pump modules.

7. The system of claim 1, wherein a pump pulse repetition rate inside the collection volume is higher than a repetition rate of an individual pump module of the plurality of pump modules.

8. The system of claim 7, wherein the pump pulse repetition rate inside the collection volume is at least $1/t$, where t is a cool-down time of the laser sustained plasma.

9. The system of claim 7, wherein a pulse width of the individual pump module of the plurality of pump modules is at least $t/n$, where t is a cool-down time of the laser sustained plasma and n is a number of pump modules.

10. The system of claim 1, further comprising:
    at least one additional pump module configured to generate continuous wave (CW) pump illumination for the laser sustained plasma.

11. The system of claim 10, wherein the at least one additional pump module is configured to maintain the laser sustained plasma with the continuous wave pump illumination when a pump pulse repetition rate inside the collection volume is less than $1/t$ where t is a cool-down time of the laser sustained plasma.

12. A system for generating broadband illumination, comprising:
    a plasma forming material;
    a plurality of pump modules configured to generate respective pulses of pump illumination for a laser sustained plasma generated by exciting the plasma forming material, wherein at least one pump module of the plurality of pump modules is configured to generate a train of pump pulses that is interlaced in time with another train of pump pulses generated by at least one other pump module of the plurality of pump modules; and
    a plurality of non-collinear illumination paths configured to direct the respective pulses of pump illumination from the plurality of pump modules into a collection volume of the laser sustained plasma.

13. The system of claim 12, wherein the plurality of non-collinear illumination paths are non-overlapping outside the collection volume.

14. The system of claim 12, wherein the plurality of non-collinear illumination paths overlap at or near a center of the collection volume.

15. The system of claim 12, wherein the plurality of non-collinear illumination paths are configured to direct the respective pulses of pump illumination into the collection volume from different directions.

16. The system of claim 12, wherein respective focal spots of the plurality of pump modules are positioned at different locations in space.

17. The system of claim 12, wherein a total pump power delivered to the collection volume is a sum of individual pump powers delivered to the collection volume by individual pump modules of the plurality of pump modules.

18. The system of claim 12, wherein a pump pulse repetition rate inside the collection volume is higher than a repetition rate of an individual pump module of the plurality of pump modules.

19. The system of claim 18, wherein the pump pulse repetition rate inside the collection volume is at least 1/t, where t is a cool-down time of the laser sustained plasma.

20. The system of claim 18, wherein a pulse width of the individual pump module of the plurality of pump modules is at least t/n, where t is a cool-down time of the laser sustained plasma and n is a number of pump modules.

21. The system of claim 12, further comprising:
at least one additional pump module configured to generate continuous wave (CW) pump illumination for the laser sustained plasma.

22. The system of claim 21, wherein the at least one additional pump module is configured to maintain the laser sustained plasma with the continuous wave pump illumination when a pump pulse repetition rate inside the collection volume is less than 1/t, where t is a cool-down time of the laser sustained plasma.

23. The system of claim 12, further comprising one or more collection optics configured to receive broadband illumination emitted by the laser sustained plasma and further configured to direct the broadband illumination to an output.

24. The system of claim 23, wherein the output comprises an illuminator output for at least one of a metrology system or an inspection system.

25. A method of pumping laser sustained plasma, comprising:
generating pulses of pump illumination for the laser sustained plasma with a plurality of pump modules by generating, via at least one pump module, a train of pump pulses that is interlaced in time with another train of pump pulses generated by at least one other pump module of the plurality of pump modules; and
directing the respective pulses of pump illumination from the plurality of pump modules along a plurality of non-collinear illumination paths into a collection volume of the laser sustained plasma.

26. The method of claim 25, wherein the plurality of non-collinear illumination paths are non-overlapping outside the collection volume.

27. The method of claim 25, wherein the plurality of non-collinear illumination paths overlap at or near a center of the collection volume.

28. The method of claim 25, wherein the plurality of non-collinear illumination paths are configured to direct the respective pulses of pump illumination into the collection volume from different directions.

29. The method of claim 25, wherein respective focal spots of the plurality of pump modules are positioned at different locations in space.

30. The method of claim 25, wherein a total pump power delivered to the collection volume is a sum of individual pump powers delivered to the collection volume by individual pump modules of the plurality of pump modules.

31. The method of claim 25, wherein a pump pulse repetition rate inside the collection volume is higher than a repetition rate of an individual pump module of the plurality of pump modules.

32. The method of claim 31, wherein the pump pulse repetition rate inside the collection volume is at least 1/t, where t is a cool-down time of the laser sustained plasma.

33. The method of claim 31, wherein a pulse width of the individual pump module of the plurality of pump modules is at least t/n, where t is a cool-down time of the laser sustained plasma and n is a number of pump modules.

34. The method of claim 25, further comprising:
maintaining the laser sustained plasma with a continuous wave pump illumination when a pump pulse repetition rate inside the collection volume is less than 1/t, where t is a cool-down time of the laser sustained plasma.

* * * * *